United States Patent [19]

Herrmann et al.

[11] Patent Number: 5,717,726
[45] Date of Patent: Feb. 10, 1998

[54] DIGITAL FILTER

[75] Inventors: Matthias Herrmann, Hildesheim; Jürgen Kaesser, Diekholzen, both of Germany

[73] Assignee: Robert Bosch GmbH, Stuttgart, Germany

[21] Appl. No.: 522,300

[22] PCT Filed: Mar. 17, 1994

[86] PCT No.: PCT/DE94/00294

§ 371 Date: Sep. 5, 1995

§ 102(e) Date: Sep. 5, 1995

[87] PCT Pub. No.: WO94/22219

PCT Pub. Date: Sep. 29, 1994

[30] Foreign Application Priority Data

Mar. 24, 1993 [DE] Germany ............... 43 09 518.6

[51] Int. Cl.$^6$ ..................................... H04B 1/10
[52] U.S. Cl. ............... 375/350; 364/724.01; 364/724.17
[58] Field of Search ............... 375/350; 364/724.01, 364/724.17, 754, 757–759; 455/307; 348/619

[56] References Cited

U.S. PATENT DOCUMENTS 4,779,128  10/1988  Johannes et al. ............... 348/619
4,809,207   2/1989  Nillesen ........................ 364/724.17

Primary Examiner—Temesghen Ghebretinsae
Attorney, Agent, or Firm—Michael J. Striker

[57] ABSTRACT

The digital filter includes a first multiplier (2) receiving an input signal, an adder (3) connected to the first multiplier (2) to receive its output signal, a delay element (6) connected to the adder (3) to receive its output signal, a second multiplier (7) connected between the delay element (6) and a second input of the adder (3) in a feedback branch, a device (16) for supplying either of two values (K1.1, K1.2) of a first multiplier coefficient to the first multiplier (2) and a device (17) for supplying either of two values (K2.1, K2.2) of a second multiplier coefficient to the second multiplier (7). The second one (K2.2) of the two values of the second multiplier coefficient is advantageously 0, while the second one (K1.2) of the first multiplier coefficient values is equal to a quotient of a predetermined first one of the first multiplier coefficient values and a difference between one and a predetermined first one of the second multiplier coefficient values.

5 Claims, 2 Drawing Sheets

DIGITAL FILTER

BACKGROUND OF THE INVENTION

The invention relates to a digital filter which can be switched over between a first characteristic and a second characteristic, it being possible to supply signals which are to be filtered from an input via an adder to an output, and it being possible for the signals at the output to be fed back via a delay element to the adder.

The operation of filters can be considerably adversely affected by brief interference with the signals which are to be filtered. Thus, for example, low-pass filters have been proposed in broadcast radio receivers in order to derive a signal which represents the received field strength, for example in the German Patent Application P 43 09 518.6 from the applicant. Furthermore, broadcast radio receivers have been disclosed in which it is possible to switch over very quickly from one received frequency to another. This is necessary in particular for testing the capability to receive so-called alternative frequencies. In this case, it is once again important to obtain, as quickly as possible after switching over, a signal which represents the received field strength.

SUMMARY OF THE INVENTION

It is thus the object of the present invention to specify a digital filter which can be switched over between a first characteristic and a second characteristic and, after switching over from the second characteristic to the first characteristic, carries out the filtering of the supplied signal as far as possible without any transient process. The first characteristic can correspond to, for example, a low-pass filter.

This object is achieved according to the invention in that a first multiplier is arranged between the input and a first input of the adder, and a second multiplier is arranged between the delay element and a second input of the adder, and in that a first coefficient can be supplied to the first multiplier and a second coefficient can be supplied to the second multiplier, which coefficients can in each case be switched over, in the case of the second characteristic the second coefficient being zero and the first coefficient being equal to the quotient of the first coefficient in the case of the first characteristic and the difference between 1 and the second coefficient in the case of the first characteristic.

The filter according to the invention has the advantage that the delay element is already loaded, when the first filter characteristic is switched on, with the sample which is to be used for feedback. The second characteristic can correspond, for example, to an all-pass filter. A constant level of transmission of the low frequencies is achieved in the case of the digital filter according to the invention in that, in the case of the second characteristic, the first coefficient is equal to the quotient of the first coefficient in the case of the first characteristic and the difference between 1 and the second coefficient in the case of the first characteristic.

A large number of digital components and assemblies are available for implementation of the filter according to the invention. Their accuracy is frequently limited, for example to 16 binary digits at inputs of multipliers and in the case of memory modules. In order nevertheless to be able to operate in other circuit parts with signals having a greater quantization accuracy, in a preferred embodiment of the invention the output signals of the adder are split into more highly significant binary digits and less significant binary digits, and that the more highly significant and the less significant binary digits on the one hand and the second coefficient on the other hand are supplied to in each case one second multiplier, whose output signals are passed via a further adder to the adder. In the case of this embodiment, processing of the less significant binary digits can be carried out in such a manner that the less significant binary digits are shifted in the direction of the more highly significant binary digits before being supplied to the delay element, and in such a manner that the output signals of the second multiplier, which is provided for the less significant binary digits, are correspondingly shifted toward less significant binary digits.

A preferred application of the filter according to the invention is distinguished by the fact that the input signals are amplitude-demodulated intermediate-frequency signals of a broadcast radio receiver, and that the coefficients are switched over to the second characteristic when interference can be expected in the intermediate-frequency signals, which interference is not intended to be included in a filtered output signal. In this case it is preferably provided that the coefficients are switched over to the second characteristic while the broadcast radio receiver is being switched over from one received frequency to another and the transient processes associated with this operation are taking place.

BRIEF DESCRIPTION OF THE DRAWING

Exemplary embodiments of the invention are explained in more detail in the following description and are illustrated using a plurality of figures in the drawing, in which.

DESCRIPTION OF THE PREFERRED EMBODIMENTS

Identical parts are provided with identical reference symbols in the figures. In order to avoid confusion with the reference symbols, the number of bits which can be dealt with simultaneously are illustrated in italics in FIG. 2.

The filter according to the invention can be implemented in various ways. Thus, for example, individual blocks or groups of the illustrated blocks can be implemented by suitable circuits, in particular integrated circuits. In the case of very large scale integration, it is furthermore possible to implement the entire digital signal processing of the receiver in one integrated circuit, signal processing steps, such as filtering operations or nonlinear weightings for example, being carried out by computation operations. Digital signal processors and other digital circuits, such as shift registers, flipflops etc for example, can also be arranged jointly within one integrated circuit in order to implement a receiver having the circuit arrangement according to the invention.

Figure 1:
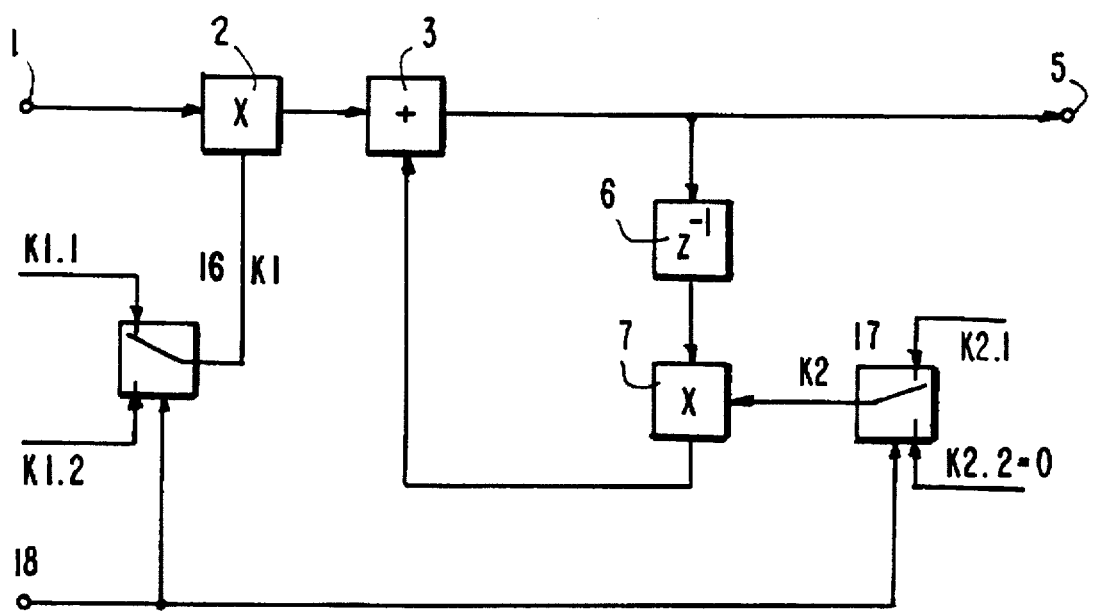
FIG. 1 is a block diagram of a first exemplary embodiment of digital filter according to the invention.

The filter which is illustrated in FIG. 1 is a first order recursive filter. The signals to be filtered are supplied to an input 1 and pass via a first multiplier to an adder 3. The output signals of the adder 3 are supplied to an output 5. The output signal is delayed by one sample period at 6 and is passed to a multiplier 7 which is part of a signal feedback path to the adder 3.

A coefficient K1 is supplied to the multiplier 2, which coefficient K1 can be switched over between the values K1.1 and K1.2=K1.1/(1−K2.1) with the aid of a changeover switch 16.

The coefficient K2 for the multipliers 7 and 13 can be switched over between the values K2.1 and K2.1 =0 with the aid of a changeover switch 17. Both changeover switches 16, 17 are controlled by a switching signal which is supplied at 18.

If the changeover switches 16, 17 are in the upper position shown, then the coefficients K1.1 and K2.1 are used. These coefficients have, for example, the numerical values K1.1= 0.125 and K2.1=0.875. The filter then operates as a first order recursive low-pass filter. No filtering is produced in this case in the lower position. The signal path between the input 1 and the output 5 represents an all-pass filter having the transfer function K1.2. However, the delay element 6 is continuously loaded with the samples of the signal which supplied at 1 and is weighted at 2. If switching over to the low-pass characteristic then takes place again, the filter does not have to carry out any renewed transient process.

Figure 2:
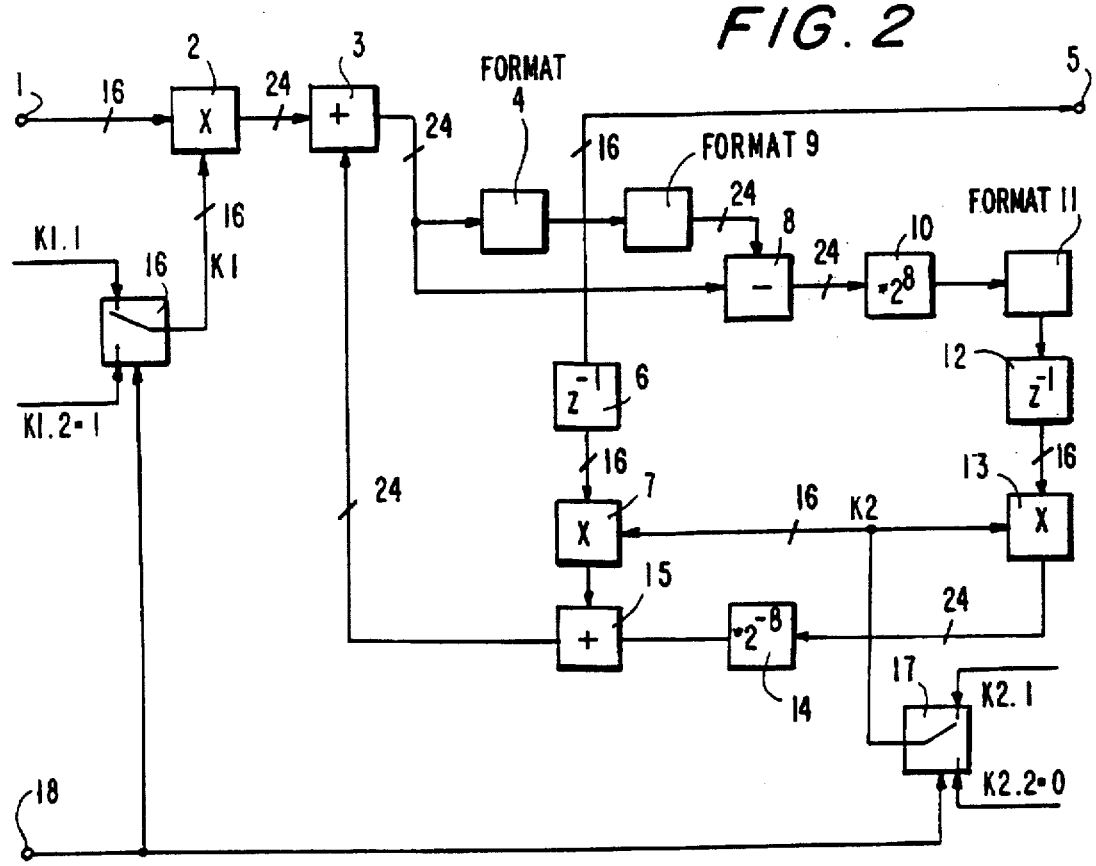
FIG. 2 shows a block diagram of a second exemplary embodiment and of the digital filter according to the invention.

In the case of the exemplary embodiment according to FIG. 2, the supplied signals have 16 binary digits or 16 bits which can be dealt with simultaneously, while the output signals of the first multiplier 2 have 24 bits and the output signals of the adder 3 have 24 bits. After format conversion at 4, signals are produced which correspond to the 16 most significant bits of the output signals of the adder 3.

The eight less significant binary digits which are not present in the output signal are admittedly not required for the output signal but are required for the signal which is fed back to the adder 3. These binary digits are cut off the output signal of the adder 3 with the aid of a subtractor 8 and a format converter 9 and are shifted through eight binary digits to the left at 10, so that they are located in the central byte of the signal which has 24 bits.

After a further format conversion at 11, a signal is produced which has 16 bits and whose eight less significant bits represent the eight less significant bits of the output signal of the adder 3. This signal is delayed by one sampling period at 12 and is multiplied at by a coefficient K2 in the same way as the 16 more highly significant binary digits. Of the output signal, which has 24 bits, of the multiplier 13, all the binary digits are once again shifted by eight positions in the direction of the less significant binary digits (at 14) and are supplied to the 24 more highly significant binary digits at 15. The output of the adder 15 is then connected to the adder 3.

Figure 3:
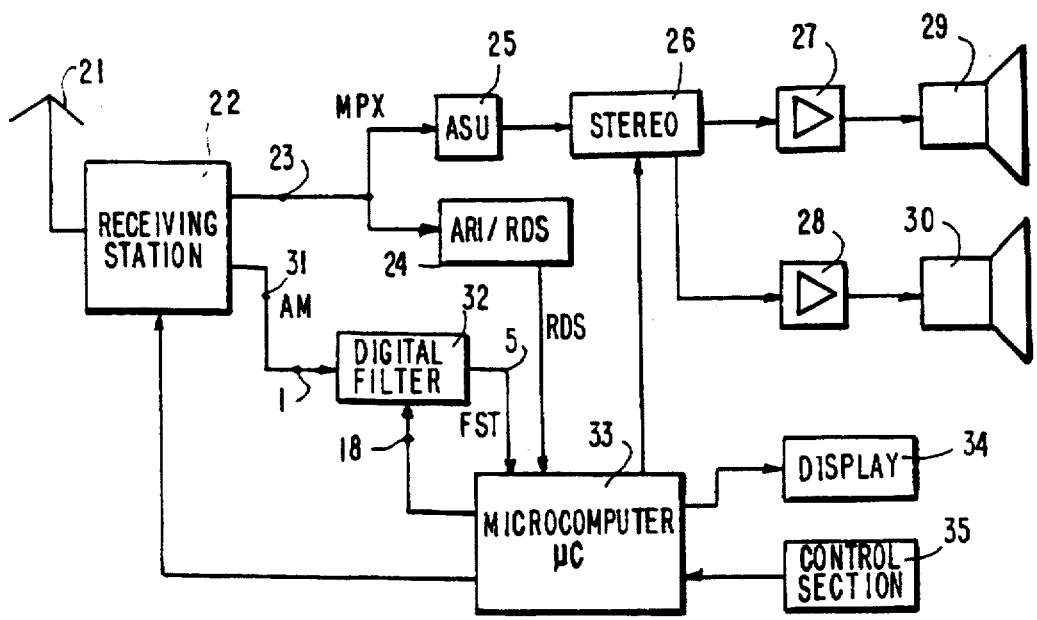
FIG. 3 is a block diagram of a radio broadcast receiver including a digital filter according to the invention.

FIG. 3 shows essential parts of a broadcast radio receiver, in particular those parts which are required in order to explain the operation of a filter according to the invention, within the broadcast radio receiver. The signal which is received via an antenna 21 is amplified, selected and demodulated in a manner known per se in a receiving section (tuner) 22. A demodulated multiplex signal MPX can be extracted at an output 23 of the receiving section 22 and is supplied, in a manner known per se, to a traffic radio/RDS decoder 24 and, via a circuit 25 for interference suppression, to a stereo decoder and audio processor 26. The resultant audio signals are reproduced in a known manner with the aid of two output stages 27, 28 and two loudspeakers 29, 30. Radio data signals RDS produced by the decoder 24 are passed to an input of a microcomputer 33.

The receiving section 22 has a further output 31 at which a signal AM is present which has been produced by amplitude demodulation of the FM intermediate-frequency signal. This signal AM is passed to the input 1 of a filter 32 according to the invention and is used to derive a signal FST which characterizes the received field strength and can be supplied from the output 5 of the filter 32 to an input of the microcomputer 33.

The microcomputer 33 is used in the case of the illustrated automobile radio to control various processes, in particular for setting the received transmitters via a PLL circuit, which is present in the receiving section 22 but is not illustrated, and for controlling the filter 32 via its control input 18. Control of the stereo decoder and audio processor 26 is also provided with the aid of the microcomputer 33. In this case, the volume is reduced and a stereo/mono changeover is carried out as a function of the field strength signal FST. The microcomputer 33 is furthermore connected to a display device 34 and to a control section 35.

If it is indicated to the microcomputer 33 by means of a low field strength signal FST that the transmitter being received at the moment is being received more weakly, the microcomputer 33 experimentally selects another transmitter (alternative transmitter) which is transmitting the same program, which the microcomputer identifies by means of the radio data signal RDS. This method is known per se and does not need to be explained more detail in order to explain the filter according to the invention.

During a transition from reception of one transmitter to reception of another transmitter transient processes occur, however, which are manifested by spikes in the signal AM which do not allow a particularly high received field strength to be deduced. In order that these spikes have no disturbing effects during the low-pass filtering of the signal which is present after the transient processes, the filter 32 is switched over, as has been described in conjunction with FIG. 1. In addition, during the transitional time from leaving one transmitter until steady-state reception of the other transmitter, evaluation of the signal FST in the microcomputer 33 is interrupted. However, as soon as the receiving section 22 has completed the transient processes to the newly selected transmitter, the filter 32 is switched on again by the microcomputer via the control input 18, and the signal FST is evaluated.

We claim:

1. A digital filter switchable between a first characteristic and a second characteristic and comprising an input (1) for a signal to be filtered, a first multiplier (2) connected to the input (1) to receive said signal to be filtered via the input (1) to generate a first multiplier signal from said signal to be filtered, an adder (3) having a second adder input and a first adder input connected to the first multiplier (2) to receive the first multiplier signal, said adder having an output and means for generating an output signal derived from said first multiplier signal at said output, a delay element (6) connected to the adder (3) to receive the output signal of the adder (3), a second multiplier (7) connected between the delay element (6) and said second adder input for input of a second multiplier signal to said adder (3), means for supplying a first multiplier coefficient to said first multiplier (2), means for supplying a second multiplier coefficient to said second multiplier (7), means (16) for switching said first multiplier coefficient between first multiplier coefficient values (K1.1, K1.2) and means (17) for switching said second multiplier coefficient between second multiplier coefficient values (K2.1, K2.2), wherein a second one (K2.2) of said second multiplier coefficient values is 0 and a second one (K1.2) of said first multiplier coefficient values is equal to a quotient of a predetermined first one (K1.1) of the first multiplier coefficient values and a difference between 1 and a predetermined first one (K2.1) of said second multiplier coefficient values, and for said first characteristic, said first multiplier is supplied with said predetermined first one (K1.1) of said first multiplier coefficient and said second multiplier is supplied with said predetermined first one (K2.1) of said second multiplier coefficient, but for said second characteristic, said first multiplier is supplied with said second one (K1.2) of said first multiplier coefficient and said second multiplier is supplied with said second one (K2.2) of said second multiplier coefficient.

2. The digital filter as defined in claim 1, further comprising means (4,8,9) for dividing said output signal of said adder (3) into more significant binary digits and less significant binary digits, means for supplying said more significant binary digits to said second multiplier (7) including said delay element (6), a third multiplier (13) connected via another delay element (12) to said means (4,8,9) for dividing to receive said less significant binary digits to form a third multiplier signal, means for supplying said second multiplier coefficient to said third multiplier (13) and another adder (15) connected to said second multiplier (7) and said third multiplier (13) to receive said second multiplier signal and said third multiplier signal respectively to generate an adder signal which is fed to said second adder input of said adder (3).

3. The digital filter as defined in claim 2, further comprising means (10,11) for shifting said less significant binary digits toward more significant binary digits, said means (10,11) for shifting being connected between said another delay element (12) and said means (4,8,9) for dividing, and means (14) for shifting toward less significant digits, said means (14) for shifting toward less significant digits being connected between said third multiplier (13) and said another adder (15).

4. The digital filter as defined in claim 1, wherein said signal to be filtered is an amplitude-demodulated intermediate-frequency radio signal of a broadcast radio receiver and said means for switching said second multiplier coefficient and said means for switching said first multiplier coefficient are formed so as to switch from said first ones of said first and second multiplier coefficient values to said second ones of said first and said second multiplier coefficient values when interference can be expected in said intermediate-frequency radio signal.

5. The digital filter as defined in claim 1, wherein said means for switching said second multiplier coefficient and said means for switching said first multiplier coefficient are formed so as to switch from said first ones of said first and second multiplier coefficient values to said second ones of said first and second multiplier coefficient values when said radio receiver is switched from one received frequency to another so as to generate transient processes.

* * * * *